United States Patent
Hsu et al.

(10) Patent No.: US 9,961,450 B2
(45) Date of Patent: May 1, 2018

(54) PIEZORESISTIVE MICROPHONE AND METHOD OF FABRICATING THE SAME

(71) Applicant: UNITED MICROELECTRONICS CORP., Hsin-Chu (TW)

(72) Inventors: Chang-Sheng Hsu, Hsinchu (TW); Weng-Yi Chen, Hsinchu County (TW); En-Chan Chen, Taipei (TW); Shih-Wei Li, Taoyuan (TW); Guo-Chih Wei, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 87 days.

(21) Appl. No.: 15/246,561

(22) Filed: Aug. 25, 2016

(65) Prior Publication Data

US 2018/0027337 A1    Jan. 25, 2018

(30) Foreign Application Priority Data

Jul. 21, 2016   (TW) .............................. 105123116 A (51) Int. Cl.
| | |
|---|---|
| *H01L 29/84* | (2006.01) |
| *H04R 17/02* | (2006.01) |
| *B81B 3/00* | (2006.01) |
| *B81C 1/00* | (2006.01) |

(Continued)

(52) U.S. Cl.
CPC ......... *H04R 17/025* (2013.01); *B81B 3/0021* (2013.01); *B81C 1/00158* (2013.01); *H04R 19/005* (2013.01); *H04R 31/003* (2013.01); *H04R 31/006* (2013.01); *B81B 2201/0257* (2013.01); *B81B 2203/0127* (2013.01); *B81B 2203/0315* (2013.01); *B81C 2201/013* (2013.01); *H04R 2201/003* (2013.01)

(58) Field of Classification Search
CPC ..................................................... H04R 17/025
USPC ........................................................ 257/416
See application file for complete search history.

(56) References Cited

U.S. PATENT DOCUMENTS

| | | | |
|---|---|---|---|
| 5,417,115 A * | 5/1995 | Burns ..................... | G01L 1/183 331/156 |
| 8,121,317 B2 | 2/2012 | Jhung | |

(Continued)

OTHER PUBLICATIONS

Hsu, Title of Invention: Microelectromechanical System Microphone, U.S. Appl. No. 14/630,620, filed Feb. 24, 2015.

*Primary Examiner* — Jami M Valentine
(74) *Attorney, Agent, or Firm* — Winston Hsu (57) ABSTRACT

A piezoresistive microphone includes a substrate, an insulating layer, and a polysilicon layer. A first pattern is disposed within the polysilicon layer. The first pattern includes numerous first opening. A second pattern is disposed within the polysilicon layer. The second pattern includes numerous second openings. The first pattern surrounds the second pattern. Each first opening and each second opening are staggered. A first resistor is disposed in the polysilicon and between the first pattern and the second pattern. The first resistor is composed of numerous first heavily doped regions and numerous first lightly doped regions. The first heavily doped regions and the first lightly doped regions are disposed in series. The first heavily doped region and the first lightly doped region are disposed alternately. A cavity is disposed in the insulating layer and the substrate.

19 Claims, 8 Drawing Sheets

(51) Int. Cl.
*H04R 31/00* (2006.01)
*H04R 19/00* (2006.01)

(56) References Cited

U.S. PATENT DOCUMENTS

| | | | |
|---|---|---|---|
| 8,169,041 B2 * | 5/2012 | Pahl | B81B 7/0064 |
| | | | 257/416 |
| 8,184,845 B2 * | 5/2012 | Leidl | B81B 7/0061 |
| | | | 257/416 |
| 8,237,332 B2 | 8/2012 | Kim | |
| 8,509,462 B2 | 8/2013 | Jeong | |
| 8,531,088 B2 | 9/2013 | Grosh | |
| 9,049,522 B2 | 6/2015 | Lee | |
| 9,668,064 B2 * | 5/2017 | Hsu | H04R 23/00 |
| 2003/0116813 A1 * | 6/2003 | Benzel | B81C 1/00595 |
| | | | 257/414 |
| 2010/0156238 A1 | 6/2010 | Kim | |
| 2016/0212551 A1 * | 7/2016 | Hsu | B81C 1/00182 |

* cited by examiner

PIEZORESISTIVE MICROPHONE AND METHOD OF FABRICATING THE SAME

BACKGROUND OF THE INVENTION

1. Field of the Invention

The present invention relates to a piezoresistive microphone, and more particularly to a piezoresistive microphone having a special layout for the resistor inside.

2. Description of the Prior Art

The rise of micro-electromechanical systems (MEMS) technology has enabled the development of acoustic transducers such as microphones which use silicon-wafer deposition techniques. Microphones fabricated this way are commonly referred to as MEMS microphones and can be made in various forms such as capacitive microphones, piezoresistive microphones, or piezoelectric microphones.

In a conventional piezoelectric-type MEMS microphone, piezoelectric material is used to form a diaphragm. During operation, changes in air pressure (e.g. sound waves) cause the diaphragm to vibrate which, in turn, causes charges proportional to the vibration. Sound waves are thus converted into electrical signals. In the conventional piezoresistive-type MEMS microphone, piezoresistive material is used to form the diaphragm. During operation, sound waves cause the diaphragm to vibrate which, in turn, causes resistance changes proportional to the vibration. Sound waves are thus converted into electrical signals. The capacitive-type MEMS microphone uses a principle of a capacitor where two electrodes face each other, one electrode is fixed onto a substrate and the other electrode is suspended in the air such that a vibrating plate reacts to an external acoustic pressure and is moved. When distance between the two electrodes changes due to the sound waves, the capacitance changes and sound waves are thus converted into electrical signals.

The piezoelectric-type and piezoresistive-type MEMS microphones suffer from low sensitivity and high noise. For a capacitive-type MEMS microphone, the distance between the two electrodes must be made to an exact specification. Further, the fixed and flexible electrodes must experience low stress so that they will not bend, altering the inter-electrode distance, as it has been found that the capacitive-type MEMS microphone may fail when the two electrodes bend or contact each other Therefore, a novel MEMS microphone is still required.

SUMMARY OF THE INVENTION

According to a preferred embodiment of the present invention, a piezoresistive microphone includes a substrate, an insulating layer and a polysilicon layer, a first pattern disposed within the polysilicon layer, wherein the first pattern comprises a plurality of first openings, a second pattern disposed within the polysilicon layer, wherein the second pattern comprises a plurality of second openings, wherein the first pattern surrounds the second pattern, and each first opening and each second opening are staggered, and a first resistor disposed in the polysilicon layer and between the first pattern and the second pattern, wherein the first resistor comprises a plurality of first heavily doped regions and a plurality of first lightly doped regions, the first heavily doped regions connect to the first lightly doped regions, the first heavily doped regions and the first lightly doped regions are arranged alternately and a dopant concentration of each of the first heavily doped regions is greater than a dopant concentration of each of the first lightly doped regions and a cavity disposed in the insulating layer and the substrate.

According to another preferred embodiment of the present invention, a fabricating method of a piezoresistive microphone includes providing a substrate and an insulating layer covering the substrate. An amorphous silicon layer is formed to cover the insulating layer. Later, the amorphous silicon layer is crystallized to become a first polysilicon layer. Next, a second polysilicon layer is formed to cover the first polysilicon layer. Subsequently, a first resistor is formed within the second polysilicon. The steps of forming the first resistor include forming a plurality of first lightly doped regions within the second polysilicon layer and forming a plurality of first heavily doped regions in the second polysilicon layer, wherein the first lightly doped regions connect to the first heavily doped regions. Two conductive pads are formed on the polysilicon layer and electrically connect to the first resistor. Then, the first polysilicon layer and the second polysilicon layer are etched simultaneously to form a first pattern and a second pattern, and the first resistor is disposed between the first pattern and the second pattern. Finally, the substrate and the insulating layer are etched to form a cavity.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 9 depicts a fabricating method of a piezoresistive microphone according to a preferred embodiment of the present invention, wherein:

DETAILED DESCRIPTION

Figure 1:
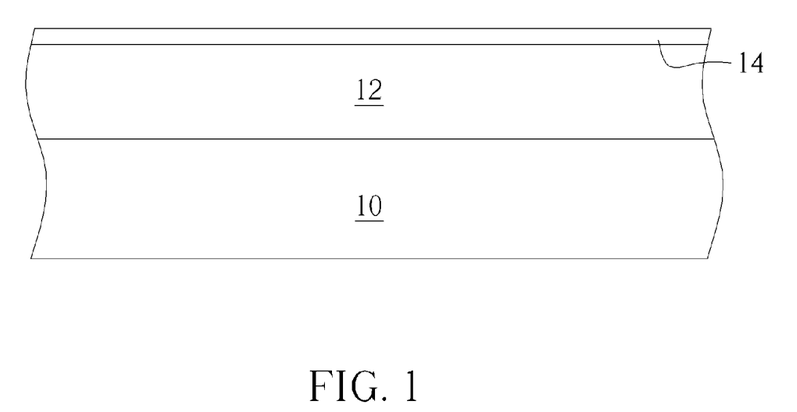
FIG. 1 is a fabricating stage of providing a substrate.
Figure 2:
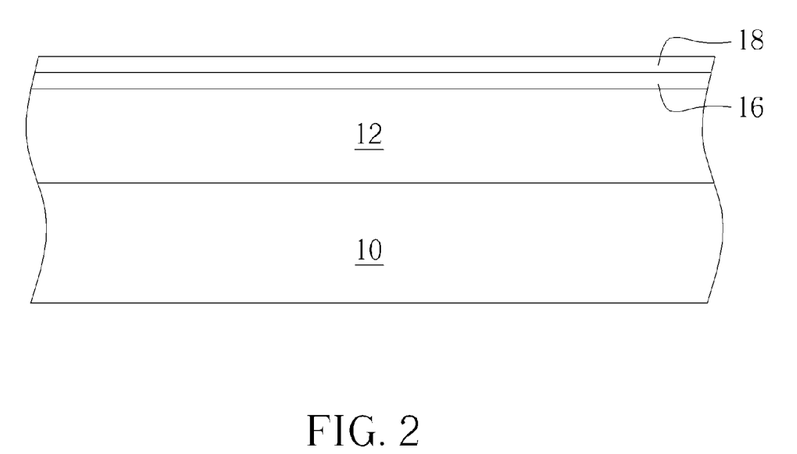
FIG. 2 is a fabricating stage following FIG. 1.

FIG. 1 to FIG. 9 depicts a fabricating method of a piezoresistive microphone according to a preferred embodiment of the present invention. As shown in FIG. 1, a substrate 10 such as a silicon substrate is provided. An insulating layer 12 is formed to entirely cover the substrate 10. The insulating layer 12 may be formed by a deposition process. The insulating layer is preferably silicon oxide. Next, an amorphous silicon layer 14 is formed to entirely cover the insulating layer 12. The stress of the amorphous silicon layer 14 can be adjusted by a doping process or an anneal process in the steps afterwards. The amorphous silicon layer 14 may be formed by a deposition process. As shown in FIG. 2, an anneal process is performed to partly or entirely crystallize the amorphous silicon layer 14 to form a first polysilicon layer 16. Originally, there is no grain in the amorphous silicon layer 14. The amorphous silicon layer 14 is annealed to form grains, and transform the amorphous silicon layer 14 into the first polysilicon layer 16. Because the number of grains between the amorphous silicon layer 14 and the first polysilicon layer 16 is different, stress of the first polysilicon layer 16 is different from the amorphous silicon layer 14. Moreover, the size or the density of the grains in the first polysilicon layer 16 can be adjusted by controlling operational parameters such as a dopant concentration, an annealing temperature, an annealing duration, or a rate of the anneal temperature. The size or the density of the grains influences the stress of the first polysilicon layer 16. Therefore, the stress of the first polysilicon layer 16 can be customized by controlling the operational parameters to make the first polysilicon layer 16 have different stresses. The first polysilicon layer 16 with different stresses can receive different audial frequencies. The present invention customizes the audial frequencies that the first polysilicon layer 16 received by crystallizing the amorphous silicon layer 14 at different operational parameters.

The amorphous silicon layer 14 can be replaced by other materials which can be adjusted for stress; for example, the amorphous silicon layer 14 can be replaced by silicon nitride.

Figure 3A:
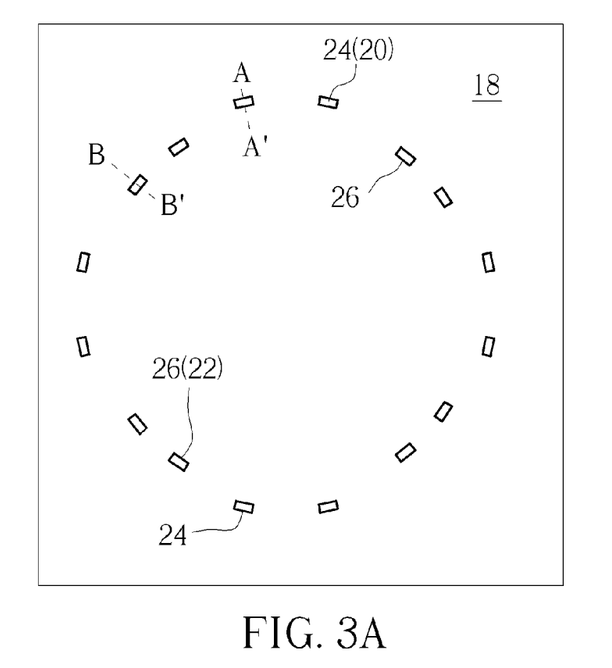
FIG. 3A is a top view following FIG. 2.
Figure 3B:
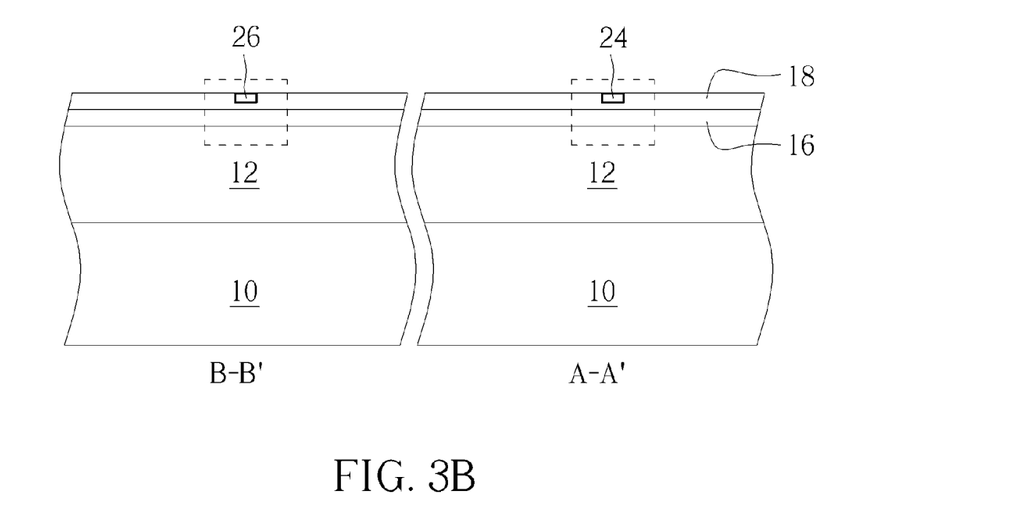
FIG. 3B depicts sectional views taken along lines AA' and BB' in FIG. 3A.

Please still refer to FIG. 2. A second polysilicon layer 18 is formed to cover the first polysilicon layer 16. The second polysilicon layer 18 is preferably a doped polysilicon layer. The second polysilicon layer 18 is a first conductive type such as a P-type or an N-type. The second polysilicon layer 18 may be formed by a deposition process. FIG. 3A is a top view continuing from FIG. 2. FIG. 3B depicts sectional views taken along lines AA' and BB' in FIG. 3A. As shown in FIG. 3A and FIG. 3B, a first resistor 20 and a second resistor 22 are formed in the second polysilicon layer 18. In detail, the steps of forming the first resistor 20 and the second resistor 22 include forming a patterned mask (not shown) to cover part of the second polysilicon layer 18. Then, a first implantation process is performed to implant dopants into the second polysilicon layer 18 to form numerous first lightly doped regions 24 and numerous second lightly doped regions 26 in the second polysilicon layer 18 by taking the patterned mask as a mask. The first lightly doped regions 24 combined with doping regions formed afterwards will serve as the first resistor 20. The second lightly doped regions 26 combined with doping regions formed afterwards will serve as the second resistor 22. The first doping region 24 and the second doping region 26 both are a second conductive type such as an N-type or a P-type. The first conductive type is different from the second conductive type, i.e. the first conductive type is P-type while the second conductive type is N-type. The depth of the second lightly doped region 26 in the second polysilicon layer 18 is approximately the same as the depth of the first lightly doped region 24 in the second polysilicon layer 18. Furthermore, both the first lightly doped region 24 and the second lightly doped region 26 are only disposed within the second polysilicon layer 18, and do not extend into the first polysilicon layer 16. The patterned mask is removed entirely after the first lightly doped region 24 and the second lightly doped region 26 are formed. In addition, at least one of the first lightly doped regions 24 and at least one of the second lightly doped regions 26 are staggered.

Figure 4A:
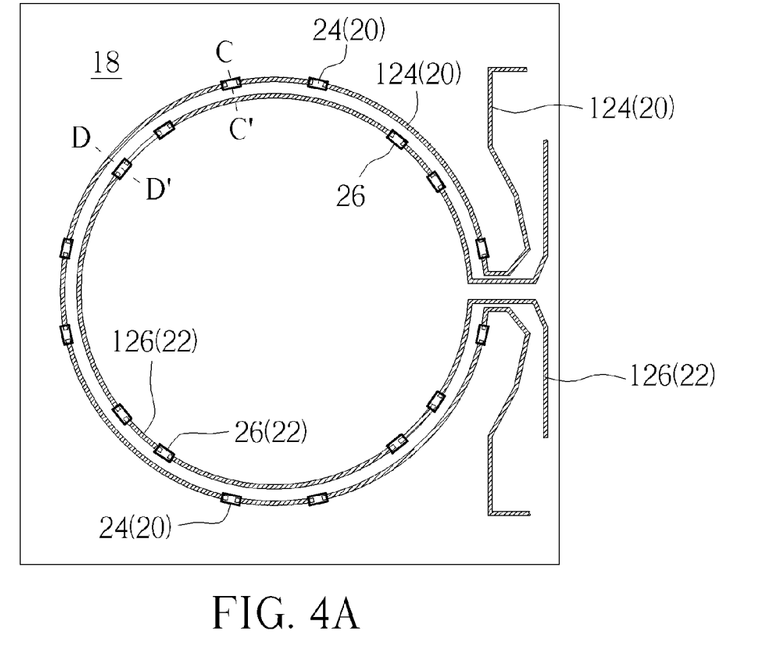
FIG. 4A is a top view following FIG. 3A.
Figure 4B:
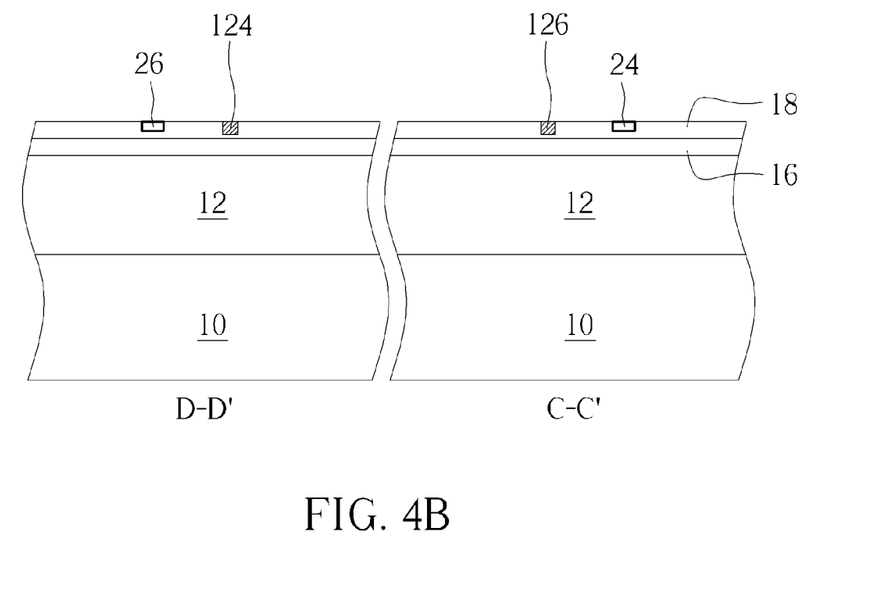
FIG. 4B depicts sectional views taken along lines CC' and DD' in FIG. 3A.

FIG. 4A is a top view continuing from FIG. 3A. FIG. 4B depicts sectional views taken along lines CC' and DD' in FIG. 3A. As shown in FIG. 4A, the steps of forming the first resistor 20 and the second resistor 22 further include: after forming the first lightly doped region and the second lightly doped region 26, forming another patterned mask (not shown) to cover part of the second polysilicon layer 18. Next, a second implantation process is performed to implant dopants into the second polysilicon layer 18 to form numerous first heavily doped regions 124 and numerous second heavily doped regions 126 in the second polysilicon layer 18 by taking the patterned mask as a mask. Then, the patterned mask is removed. A dopant concentration of each of the first heavily doped regions 124 is greater than a dopant concentration of each of the first lightly doped regions 24. A dopant concentration of each of the second heavily doped regions 126 is greater than a dopant concentration of each of the second lightly doped regions 26. Furthermore, the first heavily doped region 124 and the second heavily doped region 126 have the second conductive type. A depth of the first heavily doped region 124 is larger than a depth of the first lightly doped region 24. A depth of the second heavily doped region 126 is larger than a depth of the second lightly doped region 26. The relative positions of the first heavily doped region 124, the first lightly doped region 24, the second heavily doped region 126, and the second lightly doped region 26 are shown in FIG. 4B.

Please still refer to FIG. 4. Each of the first lightly doped regions 24 contacts or partly overlaps one of the first heavily doped regions 124 so as to make the first lightly doped regions 24 electrically connect to the first heavily doped regions 124. In detail, the first heavily doped regions 124 and the first lightly doped regions 24 are arranged alternately and connect with each other to form a ring. The ring has an opening. One of the first lightly doped regions 24 connects to two of the first heavily doped regions 124, and two ends of the first lightly doped region 24 respectively overlap one of the first heavily doped regions 124. Similarly, the second heavily doped regions 126 and the second lightly doped regions 26 are arranged alternately and connect with each other to form a ring. The ring has an opening. One of the second lightly doped regions 26 connects to two of the second heavily doped regions 126, and two ends of the second lightly doped region 26 respectively overlap one of the second heavily doped regions 126.

Figure 5:
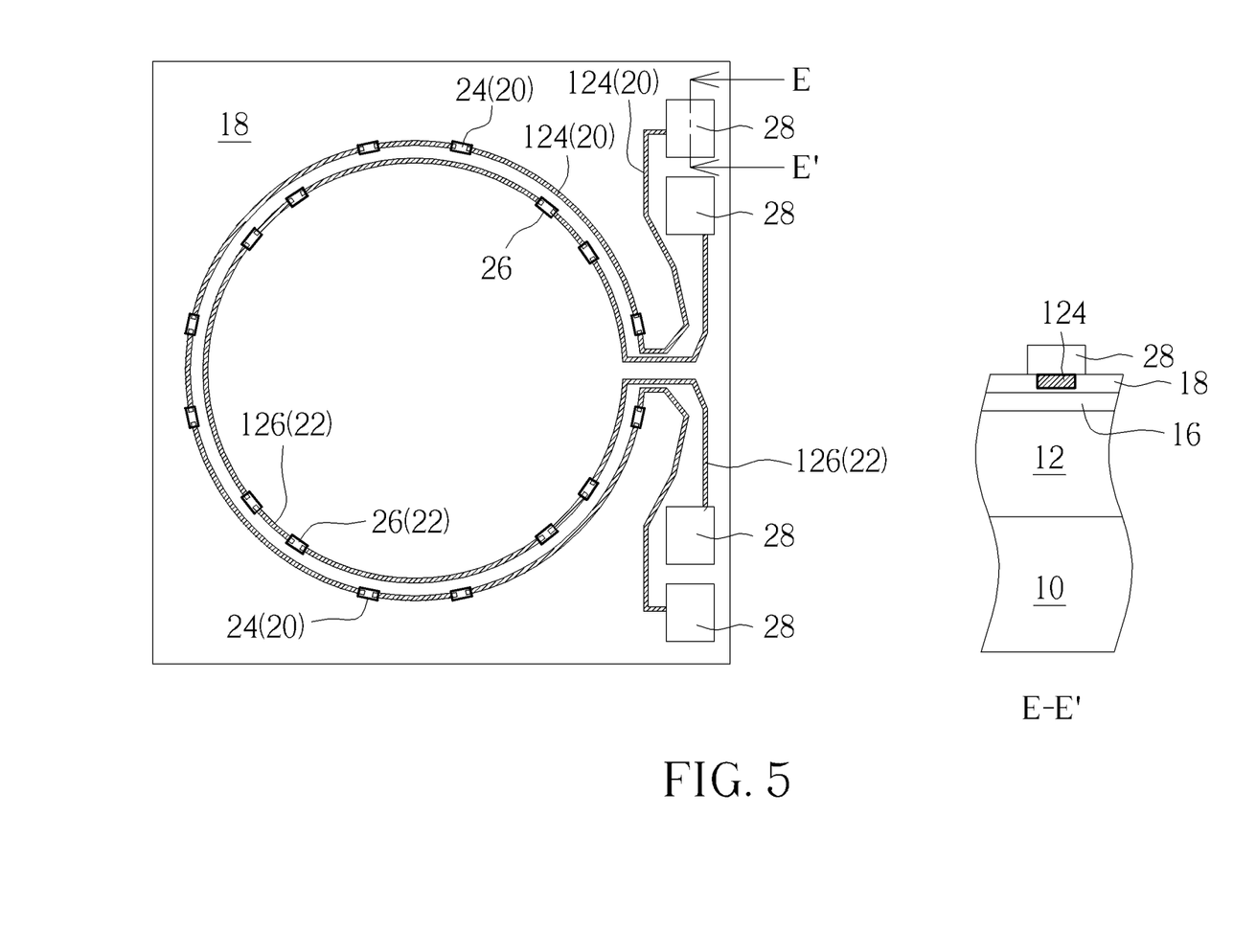
FIG. 5 shows a top view continuing from FIG. 4A and a sectional view taken along line EE' in the top view of FIG. 5.

At this point, the first resistor 20 and the second resistor 22 are completed. The first resistor 20 includes numerous first lightly doped regions 24 and numerous first heavily doped regions 124. The second resistor 22 includes numerous second lightly doped regions 26 and numerous second heavily doped regions 126. The first resistor 20 preferably surrounds the second resistor 22, and the first resistor 20 and the second resistor 22 form a concentric ring. FIG. 5 shows a top view continuing from FIG. 4A and a sectional view taken along line EE' in the top view of FIG. 5. As shown in FIG. 5, a conductive pad 28 is respectively formed at two ends of the first resistor 20 and two ends of the second resistor 22 simultaneously, i.e. four conductive pads 28 formed. The conductive pads 28 at two ends of the first resistor 20 contact the first heavily doped regions 124. The conductive pads 28 at two ends of the second resistor 22 contact the second heavily doped regions 126. Because the relative position of the conductive pads 28 and the second heavily doped regions 126 are the same as that of the conductive pads 28 and the first heavily doped regions 124, the relative position of the conductive pads 28 and the first heavily doped regions 124 can be referred to for reference. The conductive pads 28 transfer the variation of the resistance of the first resistor 20 and the second resistor 22 to other devices. The steps of forming the conductive pads 28 include forming a conductive layer. Next, a patterned mask is formed on the conductive layer. Later, the conductive layer is patterned to form the conductive pads 28 by taking the patterned mask as a mask. Finally, the patterned mask is removed.

Figure 6A:
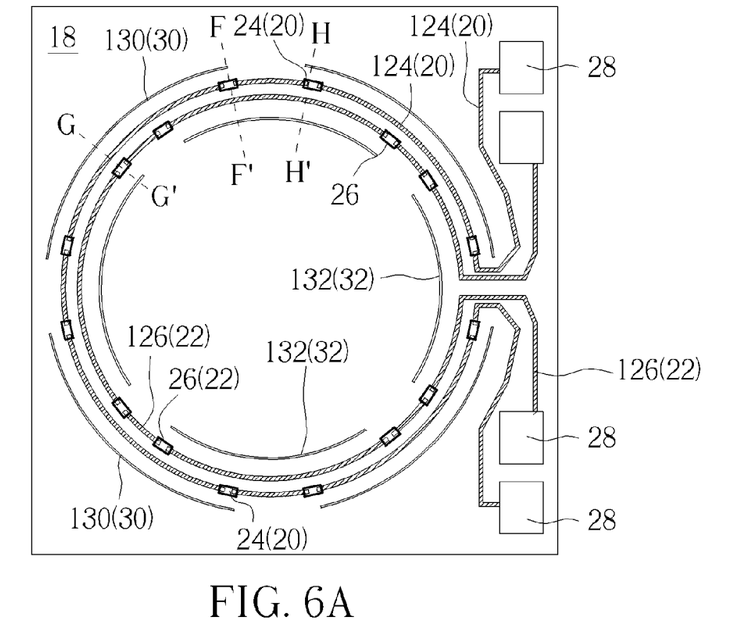
FIG. 6A is a top view following FIG. 5.
Figure 6B:
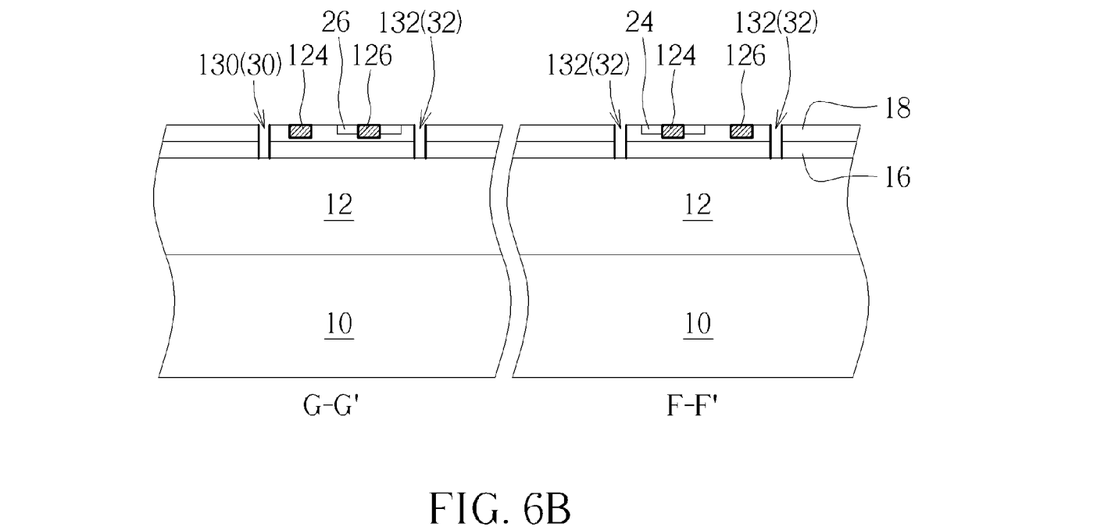
FIG. 6B depicts sectional views taken along lines FF' and GG' in FIG. 6A.
Figure 7:
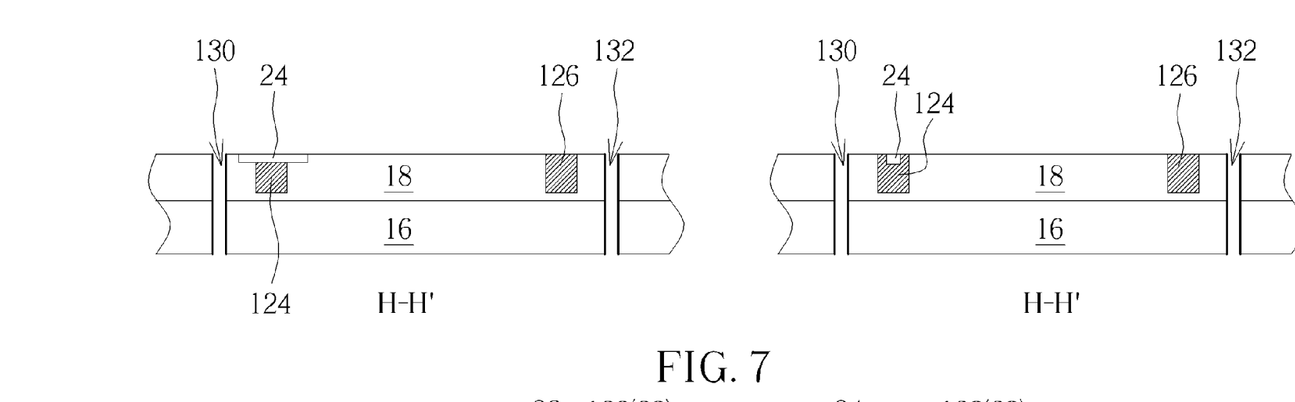
FIG. 7 depicts sectional views taken along line HH' in FIG. 6A according to two preferred embodiments of the present invention.

FIG. 6A is a top view continuing from FIG. 5. FIG. 6B depicts sectional views taken along lines FF' and GG' in FIG. 6A. FIG. 7 depicts sectional views taken along line HH' in FIG. 6A according to two preferred embodiments of the present invention. As shown in FIG. 6A and FIG. 6B, a patterned mask (not shown) is formed. The first polysilicon layer 16 and the second polysilicon layer 18 are etched simultaneously by taking the patterned mask as a mask to form a first pattern 30 and a second pattern 32 respectively in the first pattern 30 and the second pattern 32. The first resistor 20 and the second resistor 22 are disposed between the first pattern 30 and the second pattern 32. The first pattern 30 includes numerous first openings 130, and the second pattern 32 includes numerous second openings 132. The first pattern 30 surrounds the second pattern 32. At least a portion of each of the first opening 130 and at least a portion of each of the second opening 132 are staggered. Moreover, at least a portion of each of the first opening 130 and at least a portion of each of the second opening 132 are overlapped. Each of the first openings 130 has a first arc shape as seen from the top view, and each first arc shape extends to compose a first ring. The first ring, the first resistor 20 and the second resistor 22 form a concentric ring. Similarly, each of the second openings 132 has a second arc shape as seen from the top view, each second arc shape extends to compose a second ring, and the first openings 130 surrounds the second openings 132 and the first resistor 20. The second ring and the first resistor 20 form a concentric ring.

Please refer to FIG. 7. The left figure in FIG. 7 shows a sectional view taken along line HH' in FIG. 6A according to a preferred embodiment of the present invention. The right figure in FIG. 7 shows a sectional view taken along line HH' in FIG. 6A according to another preferred embodiment of the present invention. The line HH' is disposed at one end of one of the first lightly doped regions 24. As shown in the left figure in FIG. 7, an end of each of the first lightly doped regions 24 overlaps one of the first heavily doped region 124 to ensure the first lightly doped regions 24 connect to and contact the first heavily doped regions 124. The width of the first lightly doped regions 24 is larger than that of the first heavily doped region 124. Although only one end of the first lightly doped region 24 is shown in FIG. 7, the other end of the first lightly doped region 24 also connects to and contacts one of the first heavily doped regions 124 at the same relative position. As shown in the right figure in FIG. 7, an end of one of the first lightly doped region 24 overlaps one of the heavily doped regions 124. The difference between the left figure and the right figure is that, in the right figure, the width of the first lightly doped region 24 is smaller than that of the first heavily doped region 124. Furthermore, with reference to FIG. 4A and FIG. 4B, the line CC' is disposed at the middle of the first lightly doped region 24. As shown in FIG. 4B, the middle of each of the first lightly doped regions 24 does not overlap the first heavily doped region 124. Similarly, two ends of the second lightly doped region 26 respectively contact and overlap one of the second heavily doped regions 126 to ensure the second lightly doped regions 26 connect to and contact the second heavily doped regions 126. The middle of each of the second lightly doped regions 26 does not overlap the second heavily doped region 126. The relative position of the second lightly doped regions 26 and the second heavily doped regions 126 are the same as the relative position of the first lightly doped regions 24 and the first heavily doped regions 124. Please refer to FIG. 7, FIG. 4A and FIG. 4B for reference.

Figure 8:
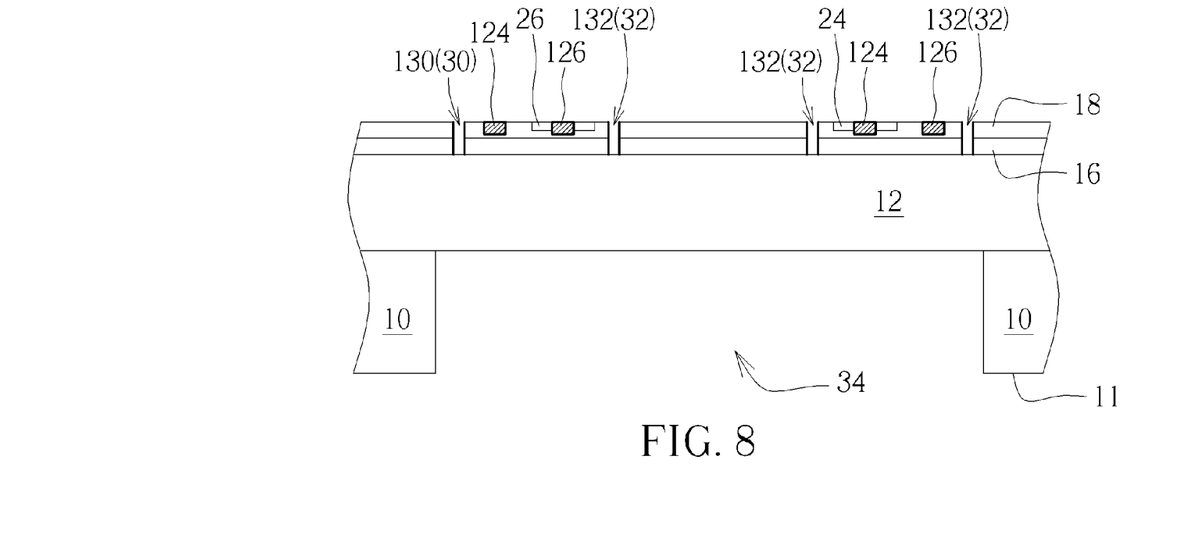
FIG. 8 depicts a sectional view following FIG. 7.
Figure 9A:
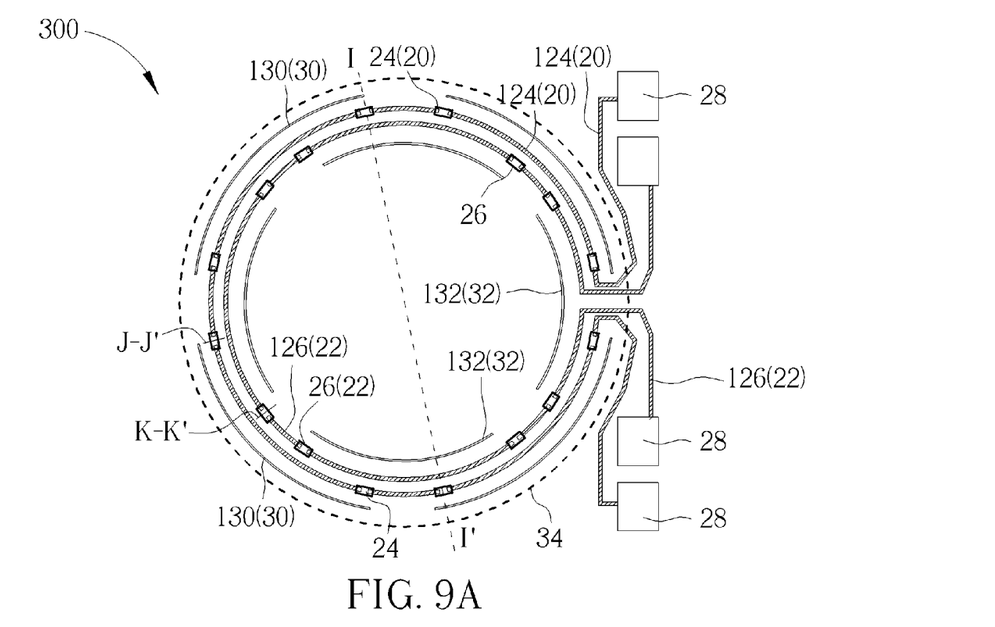
FIG. 9A is a top view following FIG. 8.
Figure 9B:
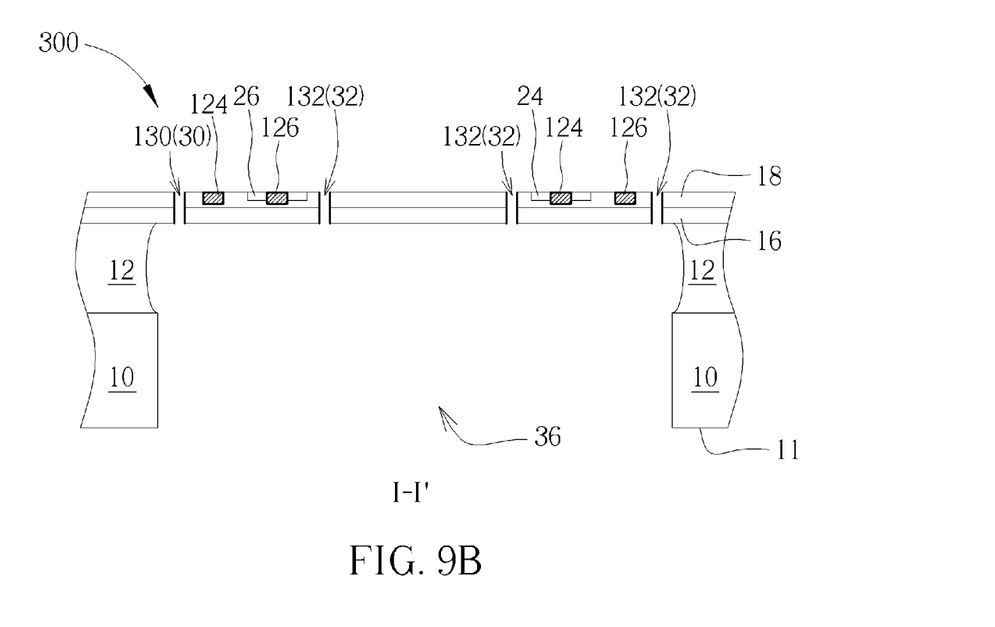
FIG. 9B depicts sectional views taken along line II' in FIG. 9A.

As shown in FIG. 8, a back side 11 of the substrate 10 is thinned. Then, a patterned mask (not shown) is formed to cover the back side 11. The back side 11 of the substrate 10 is then etched to form a cavity 34. Later, the patterned mask is removed. FIG. 9A is a top view continuing from FIG. 8. FIG. 9B depicts sectional views taken along line II' in FIG. 9A. As shown in FIG. 9A and FIG. 9B, the insulating layer 12 is etched by taking the substrate 10 as a mask. The substrate 10 and the insulating layer 12 define a vent hole 36. The vent hole 36 is marked by dotted lines as shown in FIG. 9A. At this point, the piezoresistive microphone 300 of the present invention is completed. The piezoresistive microphone 300 includes the first polysilicon layer 16 and the second polysilicon layer 18. The first pattern 30 and the second pattern 32 are disposed within the first polysilicon layer 16 and the second polysilicon layer 18. The first polysilicon layer 16 and the second polysilicon layer 18 serve as a diaphragm of the piezoresistive microphone 300.

Figure 10:
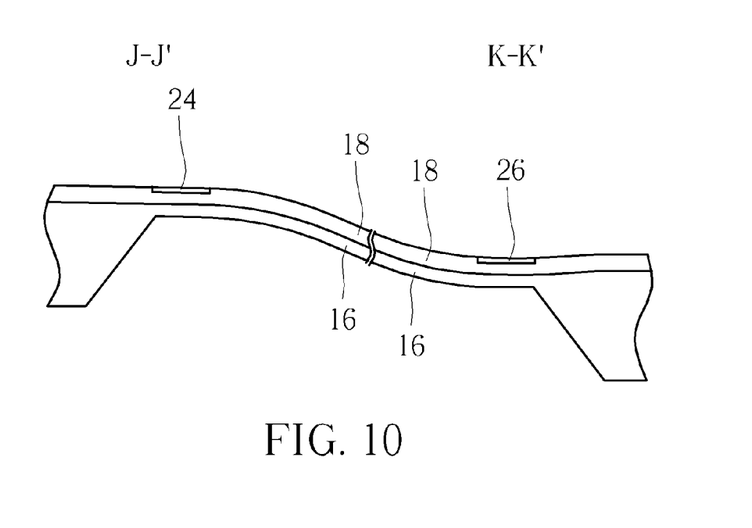
FIG. 10 depicts a sectional view taken along lines JJ' and line KK' in FIG. 9A during the vibration of the piezoresistive microphone.

Please refer to FIG. 9A and FIG. 10. FIG. 10 depicts a sectional view taken along lines JJ' and line KK' in FIG. 9A during the vibration of the piezoresistive microphone 300. As shown in FIG. 9A and FIG. 10, during the vibration of the piezoresistive microphone 300, the first lightly doped region 24 of the first resistor 20 and the second lightly doped region 26 of the second resistor 22 deform, and the resistance due to the deformation of the first lightly doped region 24 and the second lightly doped region 26 can be measured by Wheatstone bridge. Therefore, the audial signal can be converted into an electrical signal through the piezoresistive microphone 300 of the present invention. It is noteworthy that the first lightly doped region 24 and the second lightly doped region 26 deform in different directions when the diaphragm vibrates. Therefore, the electrical signals respectively converted from the first lightly doped region 24 and the second lightly doped region 26 become complementary signals and are different in sign. In this way, the audial signal sensed by the piezoresistive microphone 300 can be strengthened by using the complementary signals.

FIG. 9A and FIG. 9B depict a piezoresistive microphone according to a preferred embodiment of the present invention. FIG. 9B depicts a sectional view taken along II' in FIG. 9A. As shown in FIGS. 9A and 9B, a piezoresistive microphone 300 includes a semiconductive structure including a substrate 10, an insulating layer 12, and a polysilicon layer. The polysilicon layer includes a first polysilicon layer 16 and a second polysilicon layer 18. The second polysilicon layer 18 is on top of the first polysilicon 16. The second polysilicon layer is a first conductive type such as a P-type or an N-type. A first pattern 30 is disposed in the first polysilicon layer 16 and the second polysilicon layer 18. The first pattern includes numerous first openings 130. The second pattern 32 is disposed in the first polysilicon layer and the second polysilicon layer 18. The second pattern 32 includes numerous second openings 132. The first pattern 30 surrounds the second pattern 32. At least a portion of each of the first opening 130 and at least a portion of each of the second opening 132 are staggered. Moreover, at least a portion of each of the first opening 130 and at least a portion of each of the second opening 132 are overlapped. Each of the first openings 130 has a first arc shape as seen from the top view, and each first arc shape extends to compose a first ring. Similarly, each of the second openings 132 has a second arc shape as seen from the top view, and each second arc shape extends to compose a second ring. The first ring surrounds the second openings 132, the first resistor 20 and the second resistor 22. The first ring, the second ring, the ring formed by the first resistor 20 and the ring formed by the second resistor 22 comprise a concentric ring.

The first resistor 20 is disposed in the second polysilicon layer 18, and between the first pattern 30 and the second pattern 32. The first resistor 20 includes numerous first heavily doped regions 124 and numerous first lightly doped regions 24. The first heavily doped regions 124 and the first lightly doped regions 24 are arranged alternately and connect with each other to form a ring. The ring has an opening. A dopant concentration of each of the first heavily doped regions 124 is greater than a dopant concentration of each of the first lightly doped regions 24. The second resistor 22 is disposed in the second polysilicon layer 18 and between the first pattern 30 and the second pattern 32. The second resistor 22 is closer to the second pattern 32 and the first resistor 20 is farther from the second pattern 32. The second resistor 22 includes numerous second heavily doped regions 126 and numerous second lightly doped regions 26. The second heavily doped regions 126 and the second lightly doped regions 26 are arranged alternately and connect to each other to form a ring. A dopant concentration of each of the second heavily doped regions 126 is greater than a dopant concentration of each of the second lightly doped regions 26. A vent hole 36 is disposed in the insulating layer 12 and the substrate 10. Both of the first lightly doped regions 24 and the second lightly doped regions 26 are a second conductive type such as an N-type and a P-type. The second conductive type is different from the first conductive type, i.e. if the first conductive type is a P-type, the second conductive type is an N-type.

Each of the first lightly doped regions 24 is disposed at an end of each of the first openings 130. One of the first lightly doped regions 24 connects to two of the first heavily doped regions 124. Each of the second lightly doped regions 26 is disposed at an end of each of the second openings 132. One of the second lightly doped regions 26 connects to two of the second heavily doped regions 126. As shown in FIG. 7, an end of each of the first lightly doped regions 24 overlaps one of the first heavily doped region 124. Referring to FIG. 4A, the line CC' is disposed at the middle of the first lightly doped region 24. As shown in FIG. 4B, the middle of each of the first lightly doped regions 24 does not overlap the first heavily doped region 124. Similarly, two ends of the second lightly doped region 26 respectively contact and overlap one of the second heavily doped regions 126. The middle of each of the second lightly doped regions 26 does not overlap the second heavily doped region 126. The relative position of the second lightly doped regions 26 and the second heavily doped regions 126 are the same as the relative position of the first lightly doped regions 24 and the first heavily doped regions 124.

A conductive pad 28 is respectively disposed at two ends of the first resistor 20 and two ends of the second resistor 22 simultaneously. That is, there are four conductive pads 28. As shown in the right figure of FIG. 5, the conductive pads 28 at two ends of the first resistor 20 contact the first heavily doped regions 124. The conductive pads 28 at two ends of the second resistor 22 contact the second heavily doped regions 126. The relative position of the conductive pads 28 and the second heavily doped regions 126 are the same as that of the conductive pads 28 and the first heavily doped regions 124. The conductive pads 28 transfer the variation of the resistance of the first resistor 20 and the second resistor 22 to other devices. The diaphragm of the piezoresistive microphone 300 includes the first polysilicon layer 16 and the second polysilicon layer 18. The first pattern 30 and the second pattern 32 are disposed in the first polysilicon layer 16 and the second polysilicon layer 18. The piezoresistive microphone 300 converts the audial signal to the electrical signal by measuring the deformation of the first resistor 20 and the second resistor 22 during the vibration of the diaphragm. The present invention specially arranges the relative positions of the first lightly doped regions 24, the first heavily doped region 124 and the first openings 130. The relative positions of the second lightly doped regions 26, the second heavily doped region 126 and the second openings 132 are also specially arranged. Therefore, the deformation of the first lightly doped regions 24 is larger than that of the first heavily doped regions 124, and the deformation of the second lightly doped regions 26 is larger than that of the second heavily doped regions 126 when the diaphragm vibrates. In addition, because a dopant concentration of each of the first lightly doped region 24 is smaller than a dopant concentration of each of the first heavily doped regions 124, the resistance of each of the first lightly doped region 24 is greater than the resistance of each of the first heavily doped region 124. Similarly, the resistance of each of the second lightly doped region 26 is greater than the resistance of each of the second heavily doped region 126. The first lightly doped regions 24 and the second lightly doped regions 26 deform in different directions when the diaphragm vibrates. For example, as shown in FIG. 10, when the first lightly doped region 24 forms a convex surface, the second lightly doped region forms a concave surface. The total variation of the resistance of the first resistor 20 and the total variation of the resistance of the second resistor 22 will be different in sign when the diaphragm is vibrating. For example, while the total variation of the resistance of the first resistor 20 is a positive value, the total variation of the resistance of the second resistor 22 is a negative value.

An absolute value of the total variation of the resistance of the first resistor 20 plus an absolute value of the total variation of the resistance of the second resistor 22 becomes a differential signal. The differential signal can increase the sensitivity and the signal to noise ratio of the piezoresistive microphone 300.

The present invention utilizes the steps of crystallizing the amorphous silicon layer 14 into the first polysilicon layer 16 to customize the audial frequencies that the first polysilicon layer receives. The audial frequencies that the piezoresistive microphone 300 receives can be adjusted. Furthermore, the method of fabricating the piezoresistive microphone can be used to form numerous piezoresistive microphone respectively having different audial frequencies. Those piezoresistive microphones can comprise a set of piezoresistive microphones which can receive wide audial frequencies.

Figure 11:
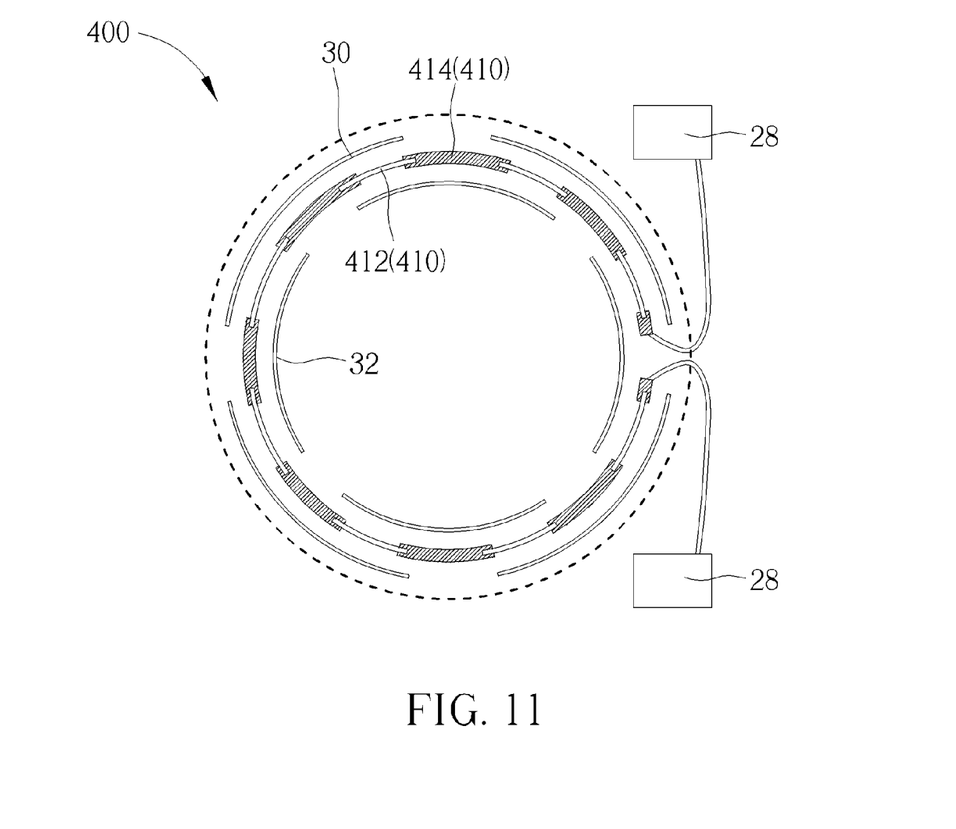
FIG. 11 depicts a piezoresistive microphone according to another preferred embodiment of the present invention.

FIG. 11 depicts a piezoresistive microphone according to another preferred embodiment of the present invention, wherein like reference numerals are used to refer to like elements throughout. As shown in FIG. 11, the fabricating method illustrated above can be used to fabricate a piezoresistive microphone 400 with only one resistor 410. The difference between the piezoresistive microphone 400 and the piezoresistive microphone 300 is that the piezoresistive microphone 400 has only one resistor 410 rather than two resistors. The resistor 410 includes numerous lightly doped regions 412 and numerous heavily doped regions 414. The lightly doped regions 412 connect to the heavily doped regions 414. Each of the lightly doped regions 412 and each of the heavily doped regions 414 are arranged alternately. A dopant concentration of each of the lightly doped regions 412 is lower than a dopant concentration of each of the heavily doped region 414. The resistor 410 is disposed between the first pattern 30 and the second pattern 32. There are two conductive pads 28 disposed at two ends of the resistor 410. Other devices in the piezoresistive microphone 400 such as the first pattern 30, the second pattern 32 or the vent hole 36 are the same as those in FIG. 10A. Therefore they are omitted here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A piezoresistive microphone comprising:
    a substrate, an insulating layer and a polysilicon layer;
    a first pattern disposed within the polysilicon layer, wherein the first pattern comprises a plurality of first openings;
    a second pattern disposed within the polysilicon layer, wherein the second pattern comprises a plurality of second openings, wherein the first pattern surrounds the second pattern, and each first opening and each second opening are staggered;
    a first resistor disposed in the polysilicon layer and between the first pattern and the second pattern, wherein the first resistor comprises a plurality of first heavily doped regions and a plurality of first lightly doped regions, the first heavily doped regions connect to the first lightly doped regions, the first heavily doped regions and the first lightly doped regions are arranged alternately and a dopant concentration of each of the first heavily doped regions is greater than a dopant concentration of each of the first lightly doped regions; and
    a cavity disposed in the insulating layer and the substrate.

2. The piezoresistive microphone of claim 1, wherein each of the first lightly doped regions is disposed at an end of each of the first openings.

3. The piezoresistive microphone of claim 2, wherein one of the first lightly doped regions connects to two of the first heavily doped regions, and two ends of the first lightly doped region respectively overlap with one of the first heavily doped regions.

4. The piezoresistive microphone of claim 1, further comprising a second resistor disposed within the polysilicon layer and between the first pattern and the second pattern, wherein the second resistor comprises a plurality of second heavily doped regions and a plurality of second lightly doped regions, the second heavily doped regions connect to the second lightly doped regions, the second heavily doped regions and the second lightly doped regions are arranged alternately and a dopant concentration of each of the second heavily doped regions is greater than a dopant concentration of each of the second lightly doped regions.

5. The piezoresistive microphone of claim 4, wherein the second resistor is closer to the second pattern and the first resistor is farther from the second pattern.

6. The piezoresistive microphone of claim 4, wherein each of the second lightly doped regions is respectively disposed at an end of each of the second openings.

7. The piezoresistive microphone of claim 6, wherein one of the second lightly doped regions connects to two of the second heavily doped regions, and two ends of the second lightly doped region respectively overlap with one of the second heavily doped regions.

8. The piezoresistive microphone of claim 4, further comprising two second conductive pads disposed on the polysilicon layer and connect to two ends of the second resistor.

9. The piezoresistive microphone of claim 1, further comprising a diaphragm made by the polysilicon layer.

10. The piezoresistive microphone of claim 1, wherein the first heavily doped regions and the first lightly doped regions have the same conductive type.

11. The piezoresistive microphone of claim 9, wherein the polysilicon layer and the first heavily doped region have different conductive types.

12. The piezoresistive microphone of claim 1, further comprising two first conductive pads disposed on the polysilicon layer and electrically connecting to two ends of the first resistor.

13. The piezoresistive microphone of claim 1, wherein each of the first openings has a first arc shape, each first arc shape extends to compose a first ring, each of the second openings has an second arc shape, each second arc shape extends to compose a second ring, and the first openings surround the second openings and the first resistor.

14. A fabricating method of a piezoresistive microphone, comprising:
    providing a substrate and an insulating layer covering the substrate;
    forming an amorphous silicon layer to cover the insulating layer;
    crystallizing the amorphous silicon layer to become a first polysilicon layer;
    forming a second polysilicon layer to cover the first polysilicon layer;
    forming a first resistor within the second polysilicon, wherein the steps of forming the first resistor comprise:
        forming a plurality of first lightly doped regions within the second polysilicon layer; and
        forming a plurality of first heavily doped regions in the second polysilicon layer, wherein the first lightly doped regions connect to the first heavily doped regions;
    forming two conductive pads on the polysilicon layer and electrically connecting to the first resistor;
    etching the first polysilicon layer and the second polysilicon layer simultaneously to form a first pattern and a second pattern, wherein the first resistor is disposed between the first pattern and the second pattern; and
    etching the substrate and the insulating layer to form a cavity.

15. The fabricating method of a piezoresistive microphone of claim 14, further comprising forming a second resistor while forming the first resistor, wherein the second resistor is closer to the second pattern and the first resistor is farther from the second pattern, the steps of forming the second resistor comprising:

forming a plurality of the second lightly doped regions within the second polysilicon layer, wherein the second lightly doped regions and the first lightly doped regions are formed simultaneously; and forming a plurality of the second heavily doped regions within the second polysilicon layer, wherein the second heavily doped regions and the first heavily doped regions are formed simultaneously, and the second lightly doped regions connect to the second heavily doped regions.

16. The fabricating method of a piezoresistive microphone of claim 14, wherein each of the first heavily doped regions and the each of the first lightly doped regions are arranged alternately, and a dopant concentration of each of the first heavily doped regions is greater than a dopant concentration of each of the first lightly doped regions.

17. The fabricating method of a piezoresistive microphone of claim 14, wherein the first pattern comprises a plurality of first openings, the second pattern comprises a plurality of second openings, the first pattern surrounds the second pattern, and each of the first openings and each of the second openings are staggered.

18. The fabricating method of a piezoresistive microphone of claim 17, wherein each of the first lightly doped regions is disposed at an end of each of the first openings.

19. The fabricating method of a piezoresistive microphone of claim 18, wherein one of the first lightly doped regions connects to two of the first heavily doped regions, and two ends of the first lightly doped region respectively overlap with one of the first heavily doped regions.

* * * * *